(12) United States Patent
Gulick et al.

(10) Patent No.: US 6,998,870 B1
(45) Date of Patent: Feb. 14, 2006

(54) METHOD AND APPARATUS FOR IMPEDANCE MATCHING IN SYSTEMS CONFIGURED FOR MULTIPLE PROCESSORS

(75) Inventors: Dale E. Gulick, Austin, TX (US); Jonathan P. Dowling, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 525 days.

(21) Appl. No.: 10/209,484

(22) Filed: Jul. 31, 2002

(51) Int. Cl.
*H03K 17/16* (2006.01)

(52) U.S. Cl. .............................. 326/30; 326/26; 326/82

(58) Field of Classification Search ............ 326/26–30, 326/82–90
See application file for complete search history.

(56) References Cited

U.S. PATENT DOCUMENTS

| | | | |
|---|---|---|---|
| 5,918,023 A | | 6/1999 | Reeves et al. |
| 6,026,456 A | * | 2/2000 | Ilkbahar ..................... 710/100 |
| 6,122,695 A | * | 9/2000 | Cronin ....................... 710/100 |
| 6,160,716 A | | 12/2000 | Perino et al. |
| 6,199,123 B1 | | 3/2001 | Simonich et al. |
| 6,292,407 B1 | * | 9/2001 | Porter et al. ............ 365/189.11 |
| 6,307,445 B1 | | 10/2001 | Makinen et al. |
| 6,573,747 B1 | * | 6/2003 | Radhakrishnan ............. 326/30 |
| 6,642,742 B1 | * | 11/2003 | Loyer ......................... 326/30 |
| 6,667,895 B1 | | 12/2003 | Jang et al. |
| 6,711,639 B1 | | 3/2004 | Singer et al. |
| 6,812,734 B1 | * | 11/2004 | Shumarayev et al. ........ 326/30 |

\* cited by examiner

*Primary Examiner*—Don Le
(74) *Attorney, Agent, or Firm*—Meyertons Hood Kivlin Kowert & Goetzel, P.C.; B. Noël Kivlin; Erick A. Heter

(57) ABSTRACT

A method and apparatus for impedance matching in systems configured for multiple processors is disclosed. In one embodiment, a computer system includes a first processor socket and a second processor socket, each configured to accommodate a processor. The processor sockets may be electrically coupled to each other. A first I/O node may be electrically coupled to the first processor socket and a second I/O node may be electrically coupled to the second processor socket. A processor may be mounted in the first processor socket, while an impedance matching circuit may be mounted in the second processor socket. The impedance matching circuit may electrically couple the processor mounted in the first processor socket to the second I/O node, thereby allowing the computer system to utilize the I/O capability provided by the second I/O node even when a second processor is not present in the system.

50 Claims, 11 Drawing Sheets

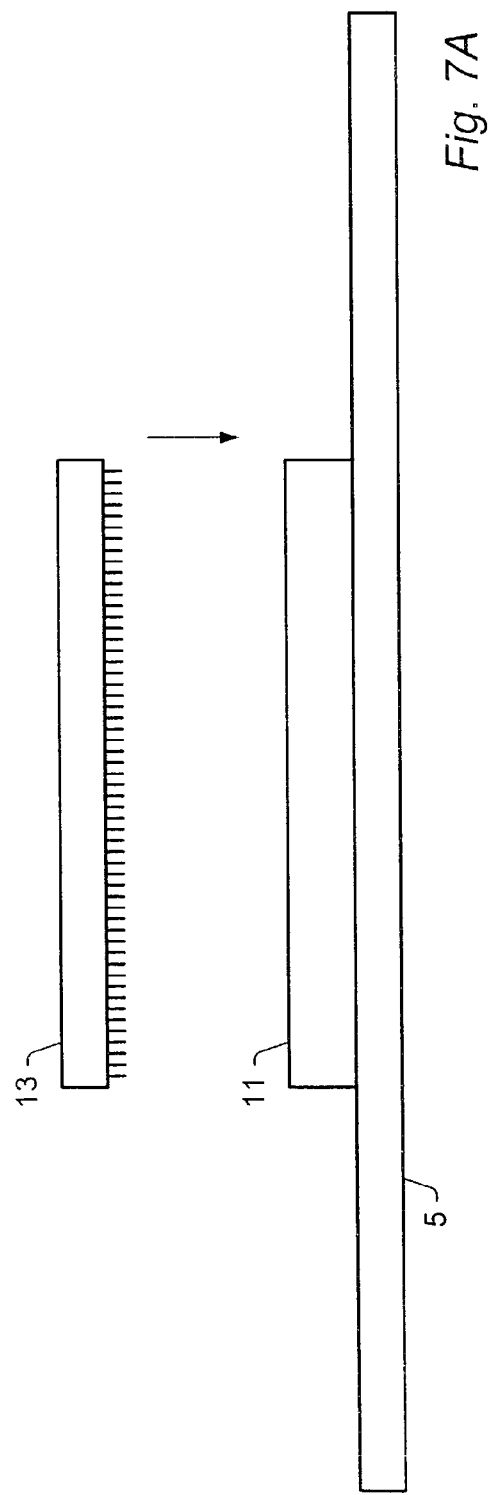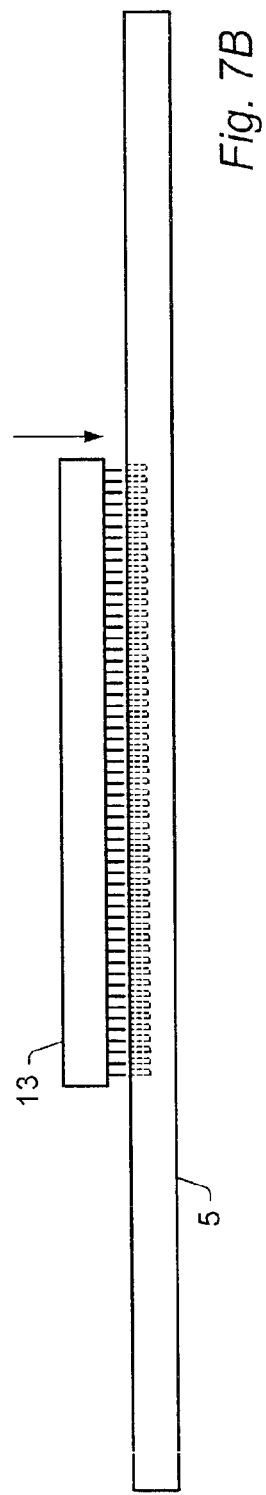

METHOD AND APPARATUS FOR IMPEDANCE MATCHING IN SYSTEMS CONFIGURED FOR MULTIPLE PROCESSORS

BACKGROUND OF THE INVENTION

1. Field of the Invention

This invention relates to computer systems, and more particularly, to impedance matching mechanisms for systems that configured for multiple processors but having one or more processors not installed.

2. Description of the Related Art

Many computer systems, such as server systems, include system boards that are configured to support multiple processors. Such computer systems typically include multiple connectors (e.g. zero-insertion force, or ZIF sockets) to accommodate the multiple processors. In addition, computer systems configured for multiple processors may include multiple bus bridges and peripheral interfaces that may be intended to be dedicated to a single one of the processors when multiple processor are installed. This may greatly increase system throughput.

Although many systems are configured to support multiple processors, such systems are often times shipped with only a single processor, or with fewer processors than the maximum number that the system is configured to accommodate. In many such computer systems, the I/O buses are coupled to the one or more processors by a single bus bridge. Thus, any processor that is in the system may utilize all of the built-in I/O capability. Furthermore, systems shipped with one or more processors not installed may still utilize the full I/O bandwidth regardless of the missing processors.

In contrast to the I/O subsystems described above, some newer I/O systems may not employ a single bus bridge. These I/O subsystems may utilize a distributed architecture including one or more bus bridges, or I/O nodes. These I/O nodes may be connected to a single processor. The processor to which each I/O node is connected may utilize the I/O bandwidth provided by the connected I/O node. Thus, a system having multiple I/O nodes, each connected to a single processor, may efficiently utilize a very large amount of I/O capability. In computer systems employing such a distributed I/O architecture, a processor missing from one of the processor slots may have the effect of reducing the system I/O bandwidth.

One possible solution to prevent the potential loss of I/O bandwidth as described above would be to provide a connecting means in the slot where a processor would normally be located. Such a connecting means may provide an electrical connection between a processor and one or more I/O nodes that would otherwise be coupled to an installed processor.

One important consideration when providing a connection means is impedance matching. In order to prevent signal reflections and other adverse affects, it may be important to carefully match the impedances of signals lines that may be coupled to each other by a connecting means in a processor slot. Due to the clock frequencies of state-of-the-art system boards, it may be difficult to provide a connection between two buses across a processor slot. Simple pin-to-pin electrical connections may be insufficient. These pin-to-pin connections may be unable to match the impedances between the coupled signal lines. The inability to match impedances between signal lines across a processor slot may result in the inability to utilize additional I/O, or may result in the need to redesign a system board.

SUMMARY OF THE INVENTION

A method and apparatus for impedance matching in systems configured for multiple processors is disclosed. In one embodiment, a computer system includes a first processor socket and a second processor socket, each configured to accommodate a processor. The processor sockets may be electrically coupled to each other. A first I/O node may be electrically coupled to the first processor socket and a second I/O node may be electrically coupled to the second processor socket. A processor may be mounted in the first processor socket, while a bridging circuit may be mounted in the second processor socket. The bridging circuit may electrically couple the processor mounted in the first processor socket to the second I/O node, thereby allowing the computer system to utilize the I/O capability provided by the second I/O node even when a second processor is not present in the system. The bridging circuit may provide impedance matched signal paths between the processor and the second I/O node.

In one embodiment, the bridging circuit may provide an impedance matched signal path using passive compensation. The bridging circuit may include circuit traces which are electrically coupled to circuit traces of a printed circuit board (PCB) or other circuit carrier. The circuit traces on the PCB may provide electrical coupling between the bridging circuit, the processor, and the second I/O node. The bridging circuit, when installed, completes the connection between the processor and the second I/O node. Each circuit trace in the bridging circuit may vary in width in order to match the impedance of the signal lines on the PCB, as well as compensating for impedance mismatches through discontinuities that may be present in the means by which the bridging circuit is coupled to the PCB.

In another embodiment, the bridging circuit may provide an impedance-matched signal path through active compensation. A bridging circuit utilizing active compensation may include circuitry configured for receiving signals from an external source (i.e. the processor or the I/O node). The received signals may be forwarded to a repeater circuit. The repeater circuit may then re-transmit the signals to their intended destination. Some embodiments of a bridging circuit utilizing active compensation may include a memory controller. The memory controller may be coupled to a memory bank that would normally be associated with a second processor which could be installed in place of the bridging circuit. The memory controller may allow the processor to access the second memory bank.

Signals may be transmitted as single-mode signals through single signals traces, or may be transmitted as differential mode signals through pairs of signal traces.

In addition to providing compensation for impedance mismatches, the bridging circuit may also compensate for potential timing mismatches. For example, some signals may be transmitted as a differential pair, including two signals of opposite polarity. In such instances, the signal traces for each signal of the differential pair, if uncompensated, may be of different lengths. In various embodiments of the bridging circuit, the signal traces for each signal of the differential pair may be routed such that the trace lengths are approximately equal. Such trace length matching may be provided for any group of associated signals. Trace length matching may be of particular importance in high-speed computer systems, as differences in the physical length in which a signal must travel can significantly affect the time period in which the signal can be properly received.

BRIEF DESCRIPTION OF THE DRAWINGS

Other aspects of the invention will become apparent upon reading the following detailed description and upon reference to the accompanying drawings in which:

FIG. 7A is a side view of one embodiment of a PCB having socket for mounting a processor and a bridging circuit configured to be placed into the processor socket;

FIG. 7B is a side view of an alternate embodiment of a printed circuit board (PCB), wherein a bridging circuit may be mounted directly to the PCB;

Figure 1:
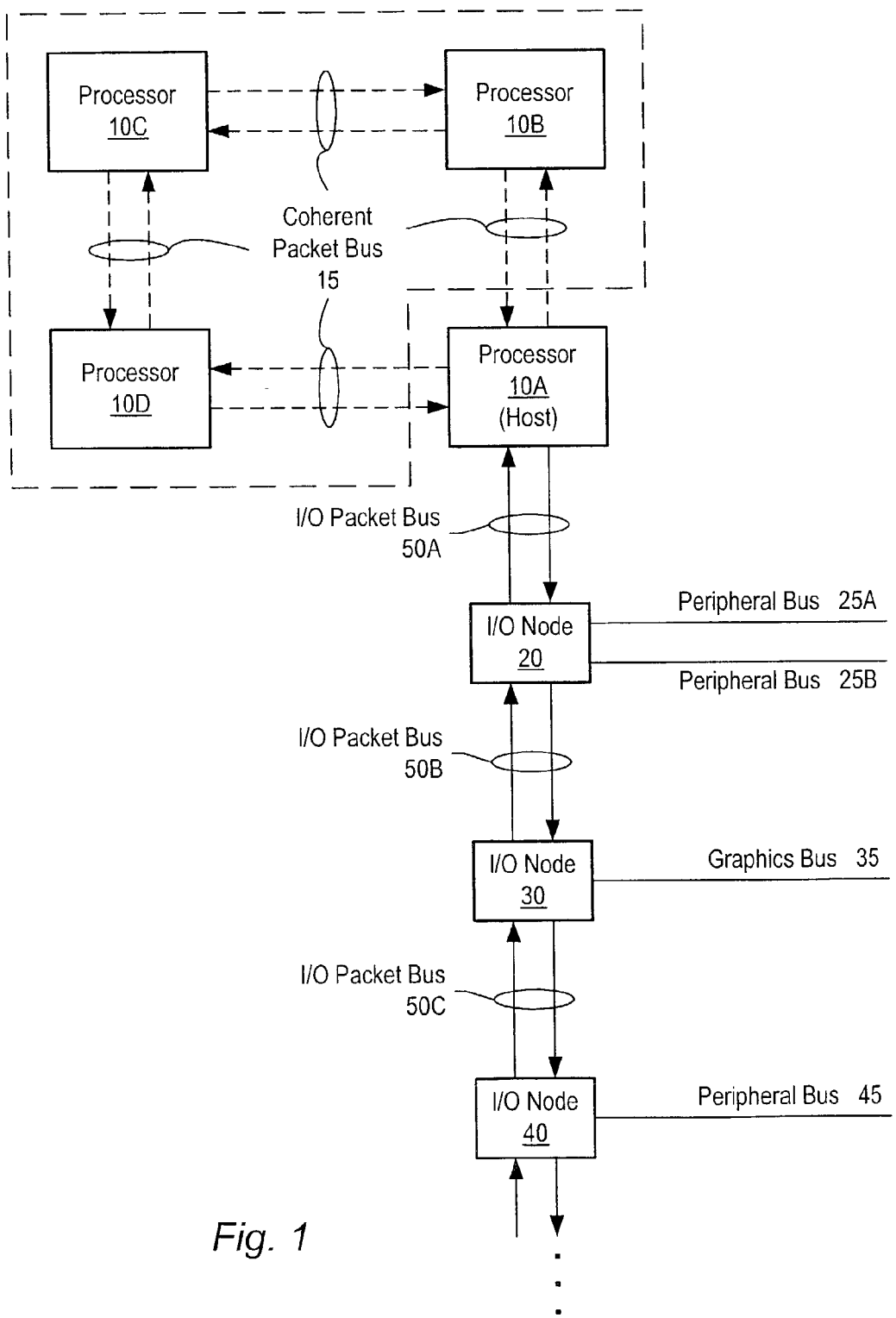
FIG. 1 is a block diagram of one embodiment of a multi-processor computer system.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a block diagram of one embodiment of a computer system is shown. The computer system includes processors 10A–10D each interconnected by a coherent packet bus 15. Each section of coherent packet bus 15 may form a point-to-point link between each of processors 10A–D. While four processors are shown using point-to point links it is noted that other numbers of processors may be used and other types of buses may interconnect them. The computer system also includes three I/O nodes numbered 20, 30 and 40 each connected together in a chain by I/O packet buses 50B and 50C respectively. I/O packet bus 50A is coupled between host node/processor 10A and I/O node 20. Processor 10A is illustrated as a host node which may include a host bridge for communicating with I/O packet bus 50A. Processors 10B–D may also include host bridges for communication with other I/O packet buses (not shown). The communication links formed by I/O packet bus 50A–C may also be referred to as a point-to-point links. I/O node 20 is connected to a pair of peripheral buses 25A–B. I/O node 30 is connected to a graphics bus 35, while I/O node 40 is connected to an additional peripheral bus 45.

Processors 10A–10D are each illustrative of, for example, an x86 microprocessor such as an Athlon™ microprocessor. In addition, one example of a packet bus such as I/O packet bus 50A–50C may be a non-coherent HyperTransport™. Peripheral buses 25A–B and peripheral bus 45 are illustrative of a common peripheral bus such as a peripheral component interconnect (PCI) bus. Graphics bus 35 is illustrative of an accelerated graphics port (AGP), for example. It is understood, however, that other types of microprocessors and other types of peripheral buses may be used.

It is noted that while three I/O nodes are shown connected to host processor 10A, other embodiments may have other numbers of nodes and those nodes may be connected in other topologies. The chain topology illustrated in FIG. 1 is shown for its ease of understanding.

In the illustrated embodiment, the host bridge of processor 10A may receive upstream packet transactions from downstream nodes such as I/O node 20, 30 or 40. Alternatively, the host bridge of processor 10A may transmit packets downstream to devices such as peripheral devices (not shown) that may be connected to peripheral bus 25A for example.

During operation, I/O node 20 and 40 may translate PCI bus transactions into upstream packet transactions that travel in I/O streams and additionally may translate downstream packet transactions into PCI bus transactions. All packets originating at nodes other than the host bridge of processor 10A may flow upstream to the host bridge of processor 10A before being forwarded to any other node. All packets originating at the host bridge of processor 10A may flow downstream to other nodes such as I/O node 20, 30 or 40. As used herein, "upstream" refers to packet traffic flow in the direction of the host bridge of processor 10A and "downstream" refers to packet traffic flow in the direction away from the host bridge of processor 10A. Each I/O stream may be identified by an identifier called a Unit ID. It is contemplated that the Unit ID may be part of a packet header or it may be some other designated number of bits in a packet or packets. As used herein, "I/O stream" refers to all packet transactions that contain the same Unit ID and therefore originate from the same node.

To illustrate, a peripheral device on peripheral bus 45 initiates a transaction directed to a peripheral device on peripheral bus 25. The transaction may first be translated into one or more packets with a unique Unit ID and then transmitted upstream. It is noted that each packet may be encoded with specific information which identifies the packet. For example the Unit ID may be encoded into the packet header. Additionally, the type of transaction may also be encoded into the packet header. Each packet may be assigned a Unit ID that identifies the originating node. Since I/O node 20 may not forward packets to a peripheral device on peripheral bus 25 from downstream, the packets are transmitted upstream to the host bridge of processor 10A. The host bridge of processor 10A may then transmit the packets back downstream with a Unit ID of the host bridge of processor 10A until I/O node 20 recognizes and claims the packet for the peripheral device on peripheral bus 25. I/O node 20 may then translate the packets into peripheral bus transactions and transmit the transactions to the peripheral device on peripheral bus 25.

As the packet transactions travel upstream or downstream, the packets may pass through one or more I/O nodes. The pass-through is sometimes referred to as a tunnel and the I/O node is sometimes referred to as a tunnel device. Packets that are sent from upstream to downstream or from downstream to upstream are referred to as "forwarded" traffic. Additionally, packet traffic that originates at a particular I/O node and is inserted into the upstream traffic is referred to as "injected" traffic.

In addition to the I/O nodes coupled to processor 10A, other I/O nodes may also be present in the computer system. A serially coupled chain of I/O nodes may be coupled to each of the one or more of processors 10B–10D in a manner similar to that in which I/O nodes 20–40 are coupled to processor 10A. In some embodiments, a processor may not be implemented in the location to which the additional I/O nodes are coupled. In such embodiments, the I/O nodes may be indirectly coupled to a processor through a bridging circuit, as will be explained in further detail below.

Figure 2:
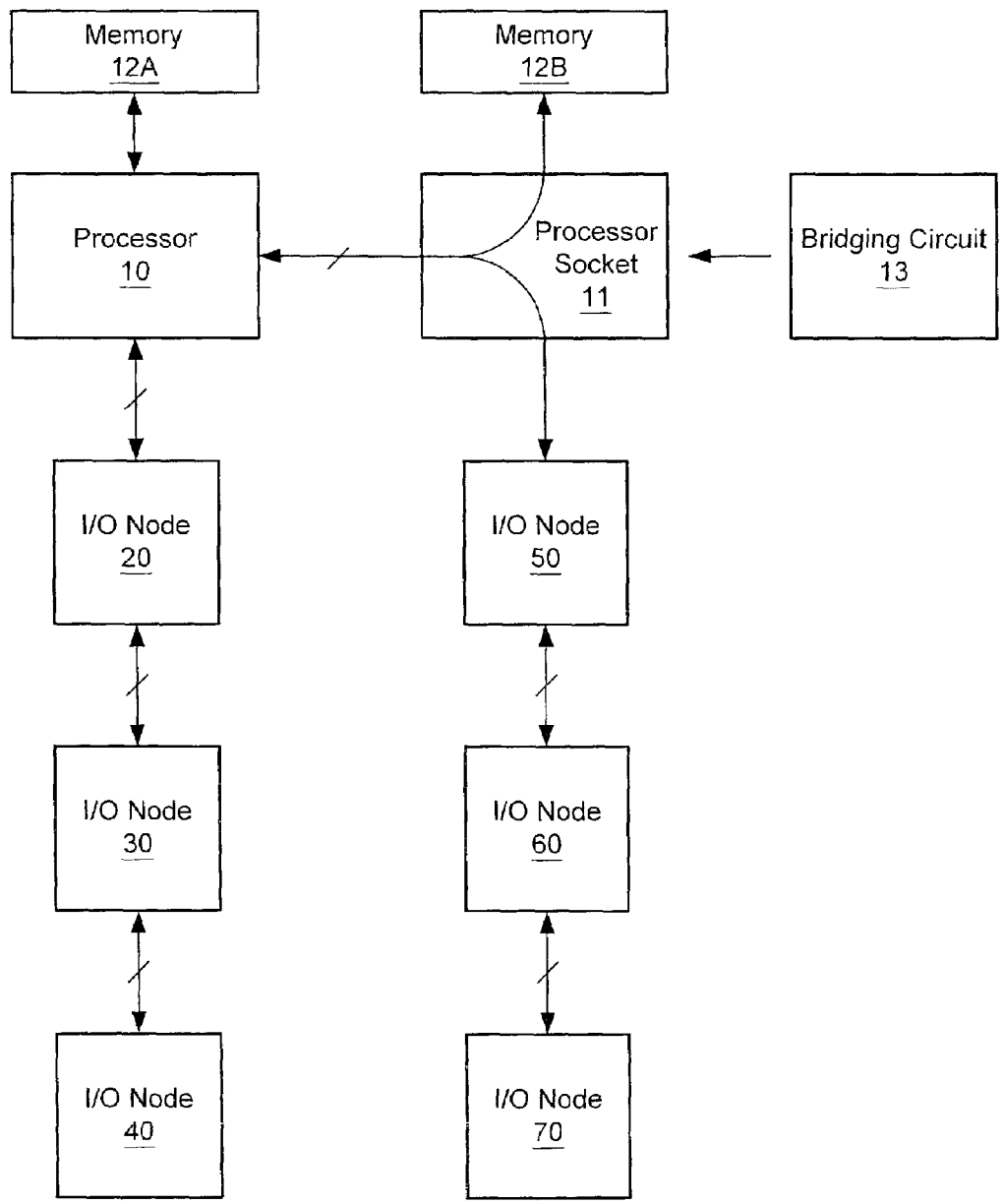
FIG. 2 is a block diagram of one embodiment of a computer system configured for multiple processors but implementing only a single processor.

Turning now to FIG. 2, a block diagram of one embodiment of a computer system configured for multiple processors but implementing only a single processor is shown. In the embodiment shown, two processor sockets are present. Processor 10 is implemented in one processor socket. I/O node 20 is coupled to processor 10, as is memory unit 12A. I/O nodes 20–40 are part of a chain of I/O nodes implemented using a topology similar to that described above.

In the embodiment shown, no processor is implemented in processor socket 11. In order to enable processor 10 to utilize the additional I/O bandwidth provided I/O nodes 50, 60, and 70, bridging circuit 13 may be placed into processor socket 11. Bridging circuit 13 may also allow processor 10 to utilize the memory capacity provided by memory unit 12B. Bridging circuit 13 may provide an impedance-matched signal path between processor 10 and I/O node 50 and memory unit 12B, and will be discussed in further detail below.

Figure 3:
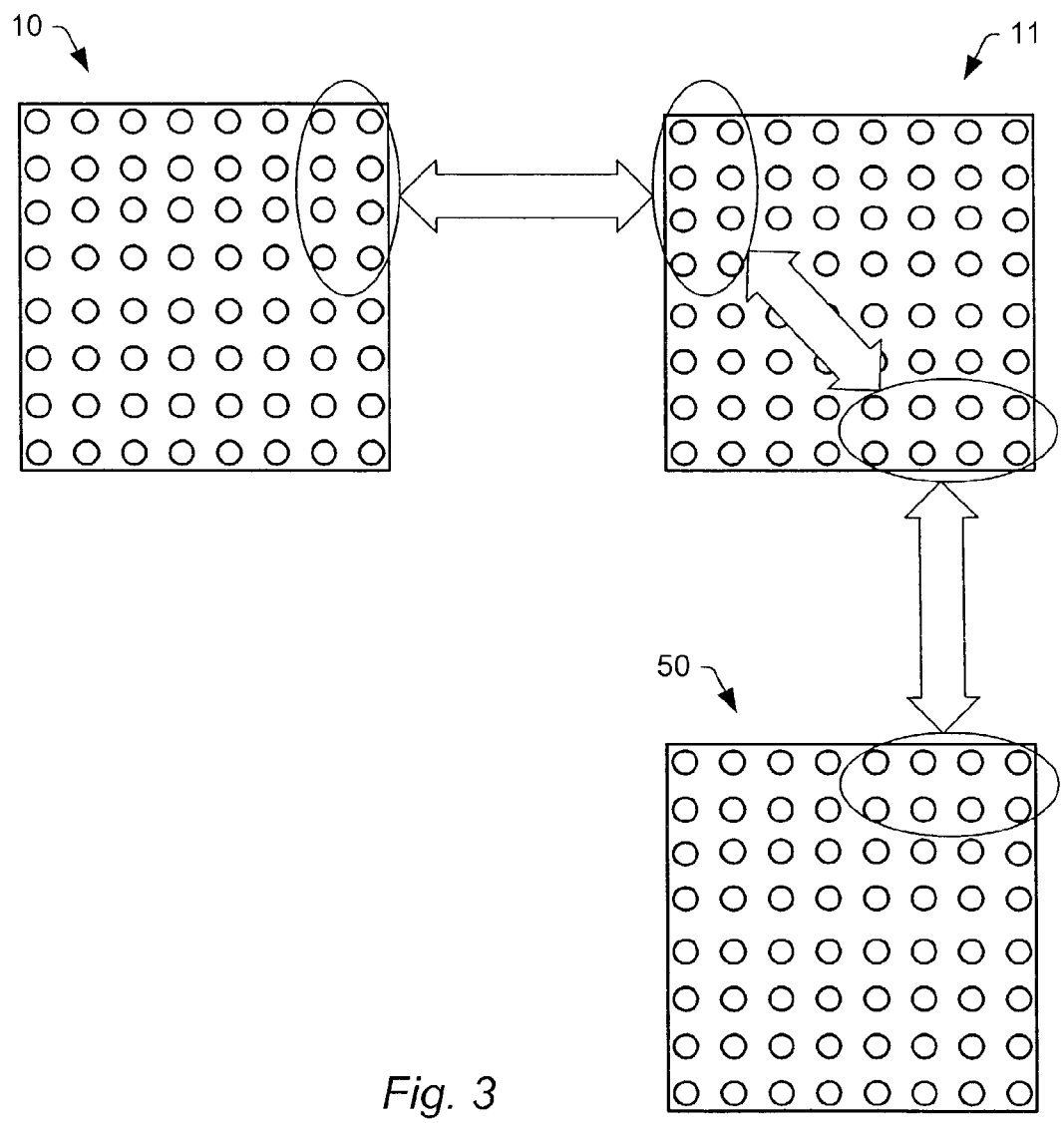
FIG. 3 is a drawing demonstrating the connection between a processor and an I/O node through a processor slot for one embodiment of a computer system.

FIG. 3 is a drawing demonstrating the connection between a processor and an I/O node through a processor slot for one embodiment of a computer system. The embodiment shown illustrates and exemplary connection between processor 10 and I/O node 50. Processor 10 may include a plurality of pins, which may be electrically coupled to processor socket 11 through signal traces on a PCB (represented here by the arrow). I/O node 50 may also be coupled to processor socket 11 by a plurality of signal traces on a PCB. A bridging circuit may be placed in processor socket 11. The bridging circuit may also include a plurality of signal lines/traces. The signal lines/traces of the bridging circuit placed in processor socket 11 may couple the signal traces from processor 10 to the signal traces from I/O node 50. Thus, with a bridging circuit present in processor socket 11, processor 10 may communicate with I/O node 50.

Figure 4A:
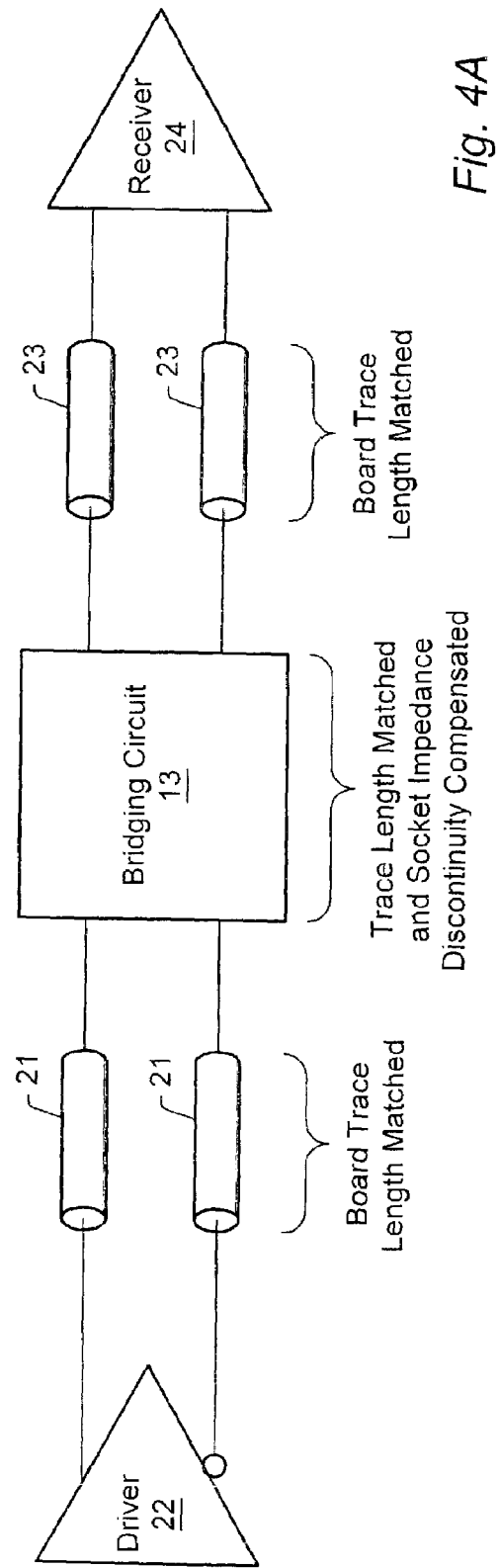
FIG. 4A is a schematic diagram illustrating a differential driver/receiver pair coupled to each other through one embodiment of a bridging circuit.

Moving now to FIG. 4A, a schematic diagram illustrating a differential driver/receiver pair coupled to each other through one embodiment of a bridging circuit is shown. In the embodiment shown, driver 22 is configured to transmit a differential signal to receiver 24. Driver 22 may be located in either processor 10 or I/O node 50, and may be one of a large plurality of drivers that may be present in either of these chips. Similarly, both processor 10 and I/O node 50 may include a plurality of receiver circuits 24. In the embodiment shown, driver 22 and receiver 24 are located in different chips. For example, driver 22 may be located in processor 10 of any one of the preceding drawings, while receiver 24 may be located in I/O node 50 of any one of the preceding drawings. Bridging circuit 13 may be provided to electrically couple processor 10 to I/O node 50.

Driver 22 may be coupled to transmit a differential signal via a pair of signal traces 21. Signal traces 21 may electrically couple driver 22 to bridging circuit 13. In order to ensure that a maximum amount of signal power is transmitted onto signal traces 21, the impedance of signal traces 21 may approximately match the output impedance of driver 22. In addition to ensuring the maximum amount of signal power is transmitted onto signal traces 21, matching the impedances may prevent signal reflections that may interfere with signal transmissions and possibly cause incorrect values to be read by receiver 24. Signal traces 21 may also be approximately matched in length to ensure that signals arrive at their intended destination at approximately the same time. Trace length matching is important to ensure a sufficient amount of setup and hold time for signals transmitted to a receiver, and may be critical for high-speed systems where the margins of error are smaller.

Receiver 24 may be coupled to signal traces 23. Signal traces 23 may be impedance matched to an input impedance of receiver 24, and may also be matched in length in the same manner as signal traces 21. Furthermore, the input impedance of receiver 24 may be selected such that it approximately matches the output impedance of driver 22.

For some embodiments of a computer system, such as those shown in FIGS. 1 and 2, bridging circuit 13 may be necessary to complete the electrical connection between a driver 22 located in processor 10 and a receiver 24 located in I/O node 50 (or a driver 22 located in I/O node 50 and a receiver 24 located in processor 10). Bridging circuit 13 include signal traces that couple signal traces 21 to signal traces 23. The signal traces of bridging circuit 13 may be configured to compensate for impedance continuities that may occur where bridging circuit 13 is coupled to the PCB upon which signal traces 21 and 23 are implemented. In other words, the signal traces of bridging circuit 13 may be configured to match the impedances of signal traces 21 and signal traces 23. The signal traces in bridging circuit 13 may also be length matched in the same manner as signal traces 21 and 23.

It should be noted that while the example shown in FIG. 4A is configured for differential signals, embodiments configured for the transmission and reception of single-ended signals are also possible and contemplated.

Figure 4B:
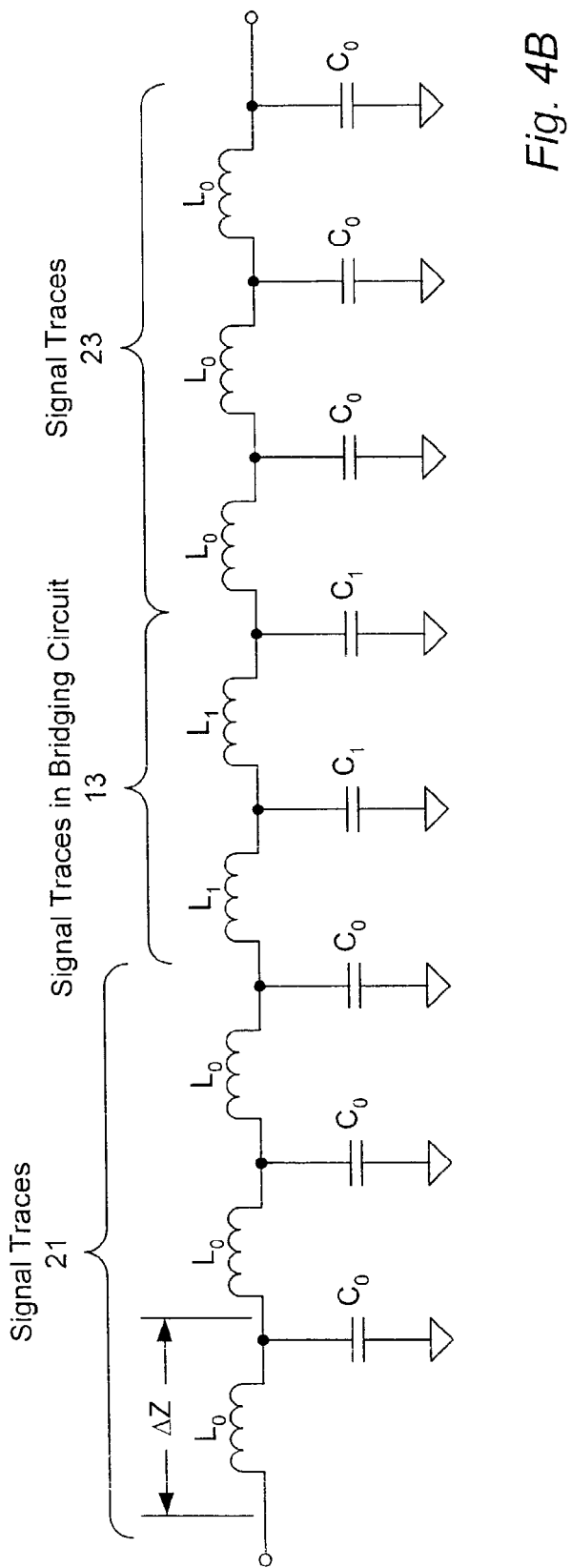
FIG. 4B is a schematic diagram illustrating the unit impedances of a printed circuit board (PCB) and a bridging circuit.

FIG. 4B is a schematic diagram illustrating the unit impedances of a single signal trace on printed circuit board (PCB) and a bridging circuit. Each of signal traces 21 and 23, as well as the signal traces in bridging circuit 13, may be modeled as a group of interconnected unit impedances (i.e. impedance per unit length, or $\Delta Z$). Each unit impedance may include a series inductance and a parallel capacitance. The series inductance and parallel capacitance represent parasitic inductances and capacitances that may occur in the signal traces. Parasitic resistances may also be present in the signal traces, connected in series with the inductors. However, at higher frequencies, the effect of the parasitic resistances may be negligible in comparison to the effects of the parasitic inductances and capacitances.

In the embodiment shown, the inductances labeled $L_0$ represent the parasitic inductances associated with signal traces 21 and 23. Similarly, the inductances labeled $C_0$ represent the parasitic capacitances associated with signal traces 21 and 23. The inductances and capacitances that comprise the unit impedances of signal traces 21/23 may be different from the inductances and capacitances of the signal traces in bridging circuit 13 (represented by $L_1$ and $C_1$, respectively). The combination of $L_1$ and $C_1$, if left uncompensated, may produce a unit impedance that is mismatched with the impedances of signal traces 21/23. This may be in part due to discontinuities in the means in which bridging circuit 13 may be coupled to the PCB (e.g. solder balls). In order to ensure that the impedance of the signal traces in bridging circuit 13 are approximately matched to that of signal traces 21/23, it may be necessary to adjust $L_1$, $C_1$, or both.

The amount of inductance or capacitance that must be changed in order to closely match the impedances of two circuit traces (or other media) may be found by the formula:

$$Z_0 = \sqrt{\frac{L}{C}}.$$

This is the general equation for the impedance of a single trace arranged over a plane, and does not apply to differential impedance matching, which will be discussed below. In this equation, the impedance value of signal traces 21/23 may be found by using the values of $L_0$ and $C_0$ in place of L and C. Inserting these values into the equation may yield the approximate matching impedance necessary for signal traces in bridging circuit 13. With the approximate matching impedance known, the value of $L_1$, $C_1$, or both may be adjusted until the impedances of signal traces 21/23 are approximately matched to the impedances of the signal traces in bridging circuit 13. In many cases, only one of the parameters (either $L_1$ or $C_1$) is adjusted in order to change the impedance of a signal trace. This may be performed by adjusting one or more dimensions of the circuit traces, as will be explained in further detail below.

As noted above, differential impedance matching may be used instead of single-trace impedance matching. The impedances for a pair of differentially matched circuit traces may be found by the formula:

$$Zod = 2 * \sqrt{\frac{(Lo - Lm)}{(Co + Cm)}},$$

wherein $L_0$ and $C_0$ are the inductance and capacitance, respectively, of a single trace in the differential pair, and Lm and Cm are the mutual inductance and mutual capacitance, respectively, of both traces in the pair. In systems using differential impedance matching, it is important to note that the mutual inductance and mutual capacitance of the differential pair may be affected by the transmission line geometry and the spacing between the traces.

Signaling on differentially-matched signal traces may utilize what is known as odd-mode excitation. Odd mode excitation may be performed by driving a true signal on one trace of the differential pair, while driving a complement of the true signal on the other trace of the differential pair. In the case of signaling using odd-mode excitation on a differential pair, the differential impedance may be twice the odd-mode impedance of the differential pair.

Figure 5:
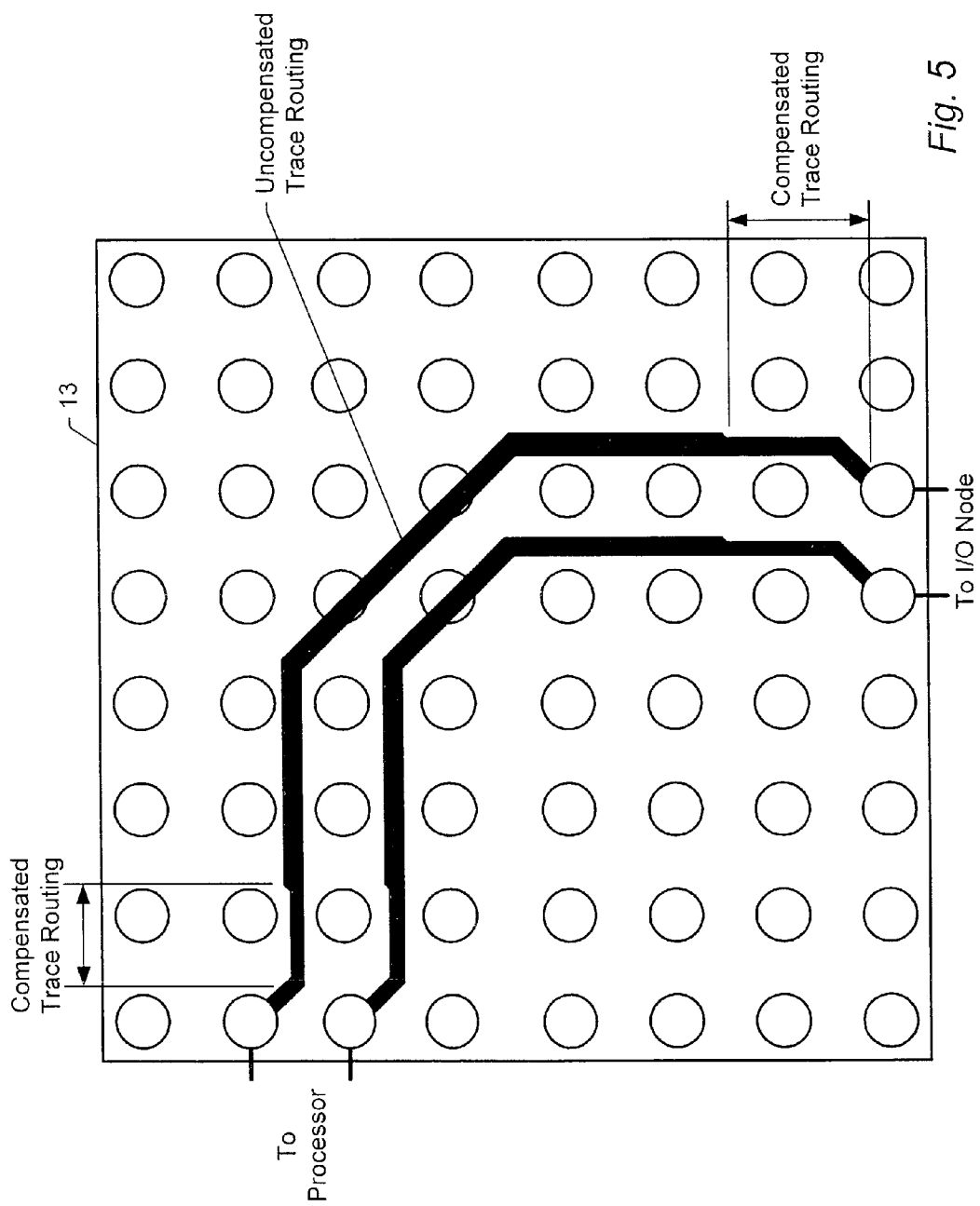
FIG. 5 is a drawing illustrating passive compensation for impedance matching for one embodiment of the bridging circuit.

Turning now to FIG. 5, a drawing illustrating passive compensation for impedance matching for one embodiment of the bridging circuit is shown. In the embodiment shown, two exemplary circuit traces are shown in bridging circuit 13. The exemplary signal traces may be representative of circuit traces that may be used to couple processor 10 to I/O node 50 for the computer systems of FIGS. 1 and 2. In the embodiment shown, the circuit traces of bridging circuit 13 include compensated and uncompensated portions. In this particular example, the compensated portions are nearest to the connecting pins to which each of the circuit traces are coupled to, and thus may compensate for discontinuities that may be present at these locations. The uncompensated portions span the length between the compensated portions of the signal trace.

The compensated portions of the signal traces, in this embodiment, are narrower than the uncompensated portions of the signal trace. Adjusting the width to make a circuit trace (or portion therefor) more narrow may have the effect of increasing the inductance the width-adjusted portion. Thus, in the embodiment shown here, the impedance of the signal traces has been compensated by increasing the inductance for the compensated portions. In other embodiments, adjustment of the capacitance may be necessary in order to achieve the desired impedance. The capacitance of a signal trace may be adjusted by increasing its width. Embodiments of bridging circuit 13 employing passive compensation may rely on the technique of adjusting the width of signal traces in order to provide impedance matching functions. However, other embodiments employing other techniques of impedance matching are possible and contemplated.

Figure 6:
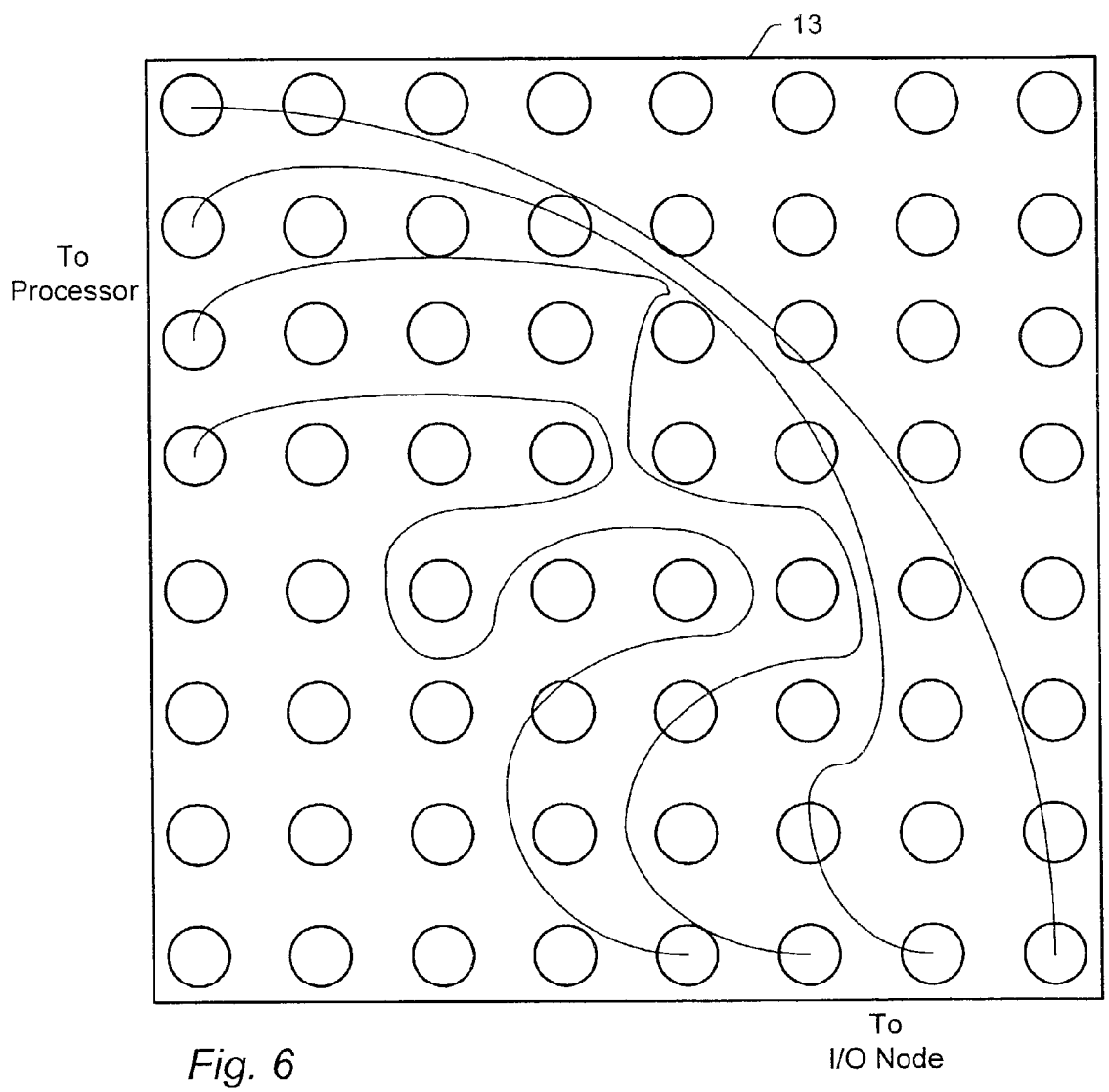
FIG. 6 is a drawing illustrating passive compensation for trace length matching for one embodiment of the bridging circuit.

FIG. 6 is a drawing illustrating passive compensation for trace length matching for one embodiment of the bridging circuit. In the embodiment shown, a plurality of signal traces are routed in order to approximately match their respective lengths. Although not explicitly shown here, these signal traces may also be of varying widths for impedance matching purposes in accordance, similar to the signal traces illustrated in FIG. 5. The approximate matching of signal trace lengths may be important for traces coupled to carry signals that must be latched by a receiver at the same time. Due to the high speed at which many computer systems currently operate, the distance which a given signal must travel between a transmitter and receiver may have a significant effect on the amount of time elapsed between transmission and reception. Thus, when multiple signals must be latched by a receiver (or plurality of receivers) at a given time, the signals may be transmitted at approximately the same time, and therefore must travel approximately the same distance in order to arrive at their respective receivers at the same time. Adjusting the trace lengths may ensure that the signals arrive at their intended destinations at approximately the same time, with sufficient setup and hold time to ensure that the proper values are latched by the receiving circuits.

FIG. 7A is a side view of one embodiment of a PCB having socket for mounting a processor and a bridging circuit configured to be placed into the processor socket. In the embodiment shown, bridging circuit 13 is implemented in a pin-grid array (PGA) package configured for insertion in processor socket 11, which is mounted upon printed circuit board 5. In other embodiments, bridging circuit 13 may be implemented in a ball-grid array (BGA), land-grid array (LGA) or other type of packaging. Bridging circuit 13 may be inserted into processor socket 11, which may also be configured to receive a processor instead of the bridging circuit. The insertion of bridging circuit 13 may provide an electrical connection between a processor and an I/O node, as described above, where such a connection might not otherwise exist.

FIG. 7B is a side view of an alternate embodiment of a printed circuit board (PCB), wherein a bridging circuit may be mounted directly to the PCB. In this embodiment, bridging circuit 13 is mounted directly to PCB 5. Instead of having an external processor socket, processor socket 11 may be integrated directly into PCB 5. In the embodiment shown, PCB 5 is configured to receive a plurality of pins of bridging circuit 13, which may be a PGA. Bridging circuit 13 may also be an LGA or BGA or other type of surface mount package, and thus processor socket 11 may include a plurality of mounting pads. It should also be noted that in some embodiments, bridging circuit 13 may be implemented using discrete components instead of a package such as that shown in FIGS. 7A and 7B.

Figure 8:
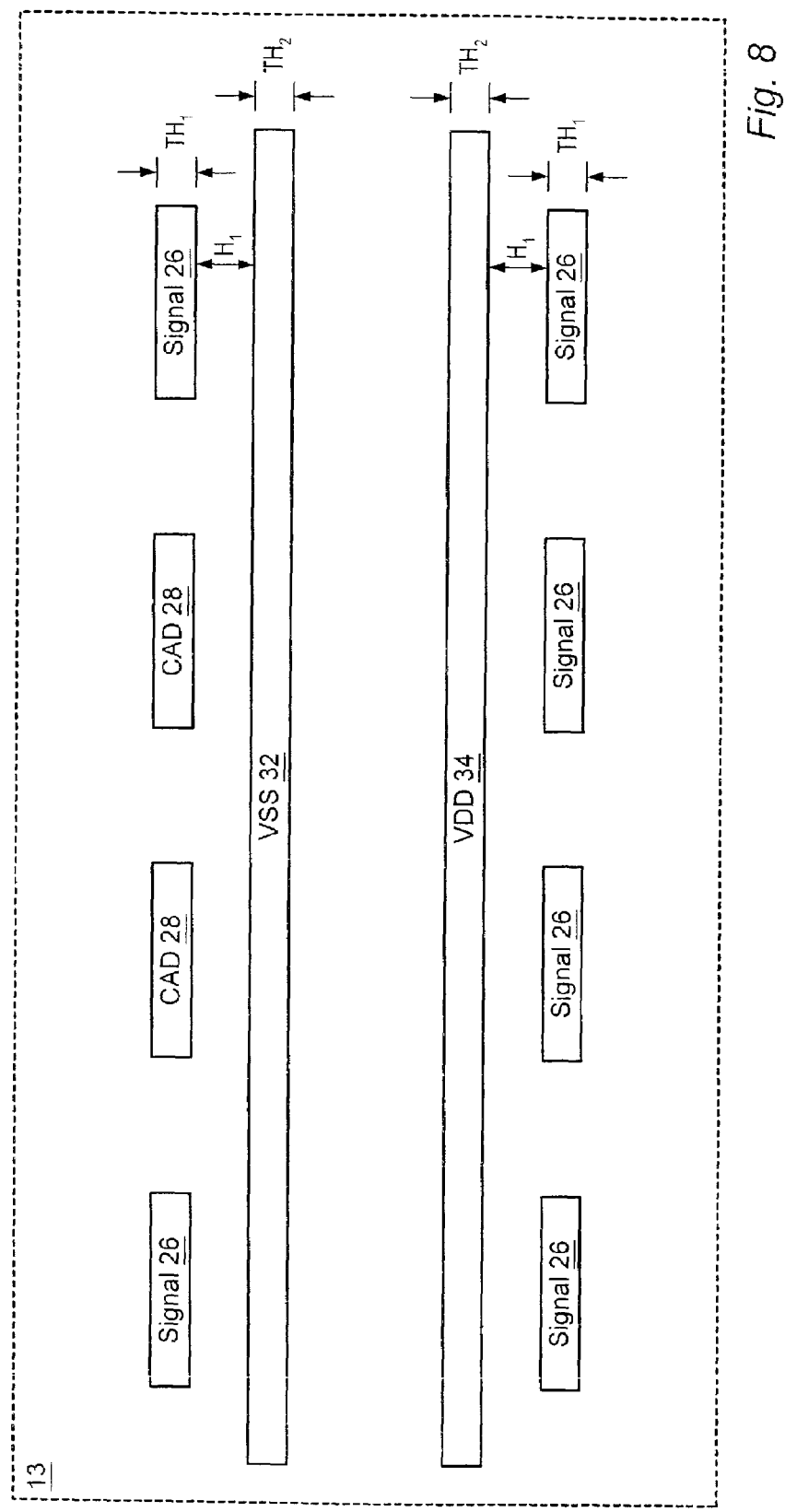
FIG. 8 is a cutaway view of the internal stack-up for one embodiment of a bridging circuit.

Moving now to FIG. 8 a cutaway view of the internal stack-up for one embodiment of a bridging circuit is shown. In the embodiment shown, bridging circuit 13 includes two voltage planes, VSS plane 32 and VDD plane 34. Embodiments employing simple power and ground planes are also possible and contemplated. Bridging circuit 13 also includes a plurality of signal traces 26 and CAD (control/address/data) traces 28. Signals traces 26 and CAD traces 28 are arranged above VSS plane 32 and below VDD plane 34. Thus, signal traces 26 and CAD traces 28 may function as micro-strip transmission lines. Embodiments utilizing other types of transmission line configurations are possible and contemplated.

Each of signal traces 26 and CAD traces 28 may be separated from their respective power plane (VDD or VSS) by a dielectric material. A distance $H_1$ may separate the traces from the planes. The ratio of trace width relative to the distance $H_1$ may affect the impedance of the traces. In general, if a trace is wide with respect to the distance $H_1$, the impedance of the trace will be lower than if the trace is narrow with respect to the distance $H_1$. Thus, changing this distance may be another technique which may be used to adjust the impedance of the signal traces in bridging circuit 13.

Figure 9:
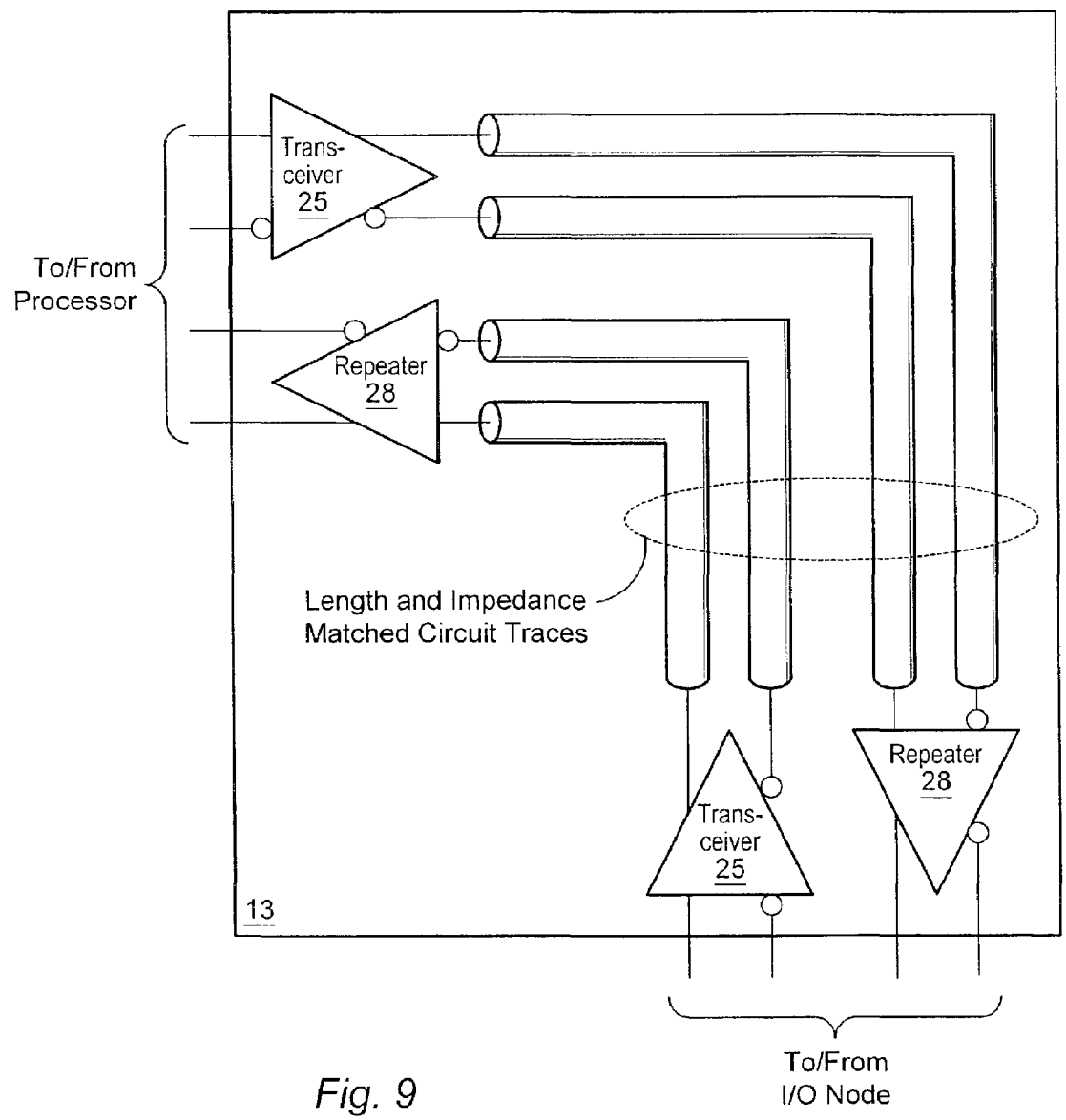
FIG. 9 is a diagram illustrating one embodiment of a bridging circuit utilizing an active compensation scheme.

FIG. 9 is a diagram illustrating one embodiment of a bridging circuit utilizing an active compensation scheme. In the embodiment shown, bridging circuit 13 includes transceivers 25 and repeaters 28. Transceivers 25 may be configured to receive differential signals from one of a processor or an I/O node. Similarly, repeaters 28 may be configured to transmit signals to one of the processor or the I/O node.

Transceivers 25 and repeaters 28 may each be electrically coupled to signals traces on a PCB. The input impedance of transceivers 25 may be approximately matched to the impedance of the signal traces to which it is coupled. The output impedance of repeaters 28 may also be approximately matched to the impedance of the signals traces to which it is coupled. Signal traces internal to bridging circuit 13 may be approximately matched to the output impedance of transceivers 25 and the input impedance of repeaters 28. Thus, bridging circuit 13 may complete an impedance matched signal path between a processor and an I/O node. Furthermore, the presence of transceivers 25 and repeaters 28 may provide for enhanced signal strength, which may result in transmitted signals in being less susceptible to interference.

Other embodiments of bridging circuit 13 employing active compensation are possible and contemplated. For example, embodiments employing a single transceiver and no repeater in each signal path may be implemented, as well as other types of bridging circuitry employing various combinations of transmitters and receivers. Furthermore, bridging circuit 13 may be implemented using a single integrated circuit, as a group of discrete components, or as a combination of discrete components and integrated circuits.

Figure 10:
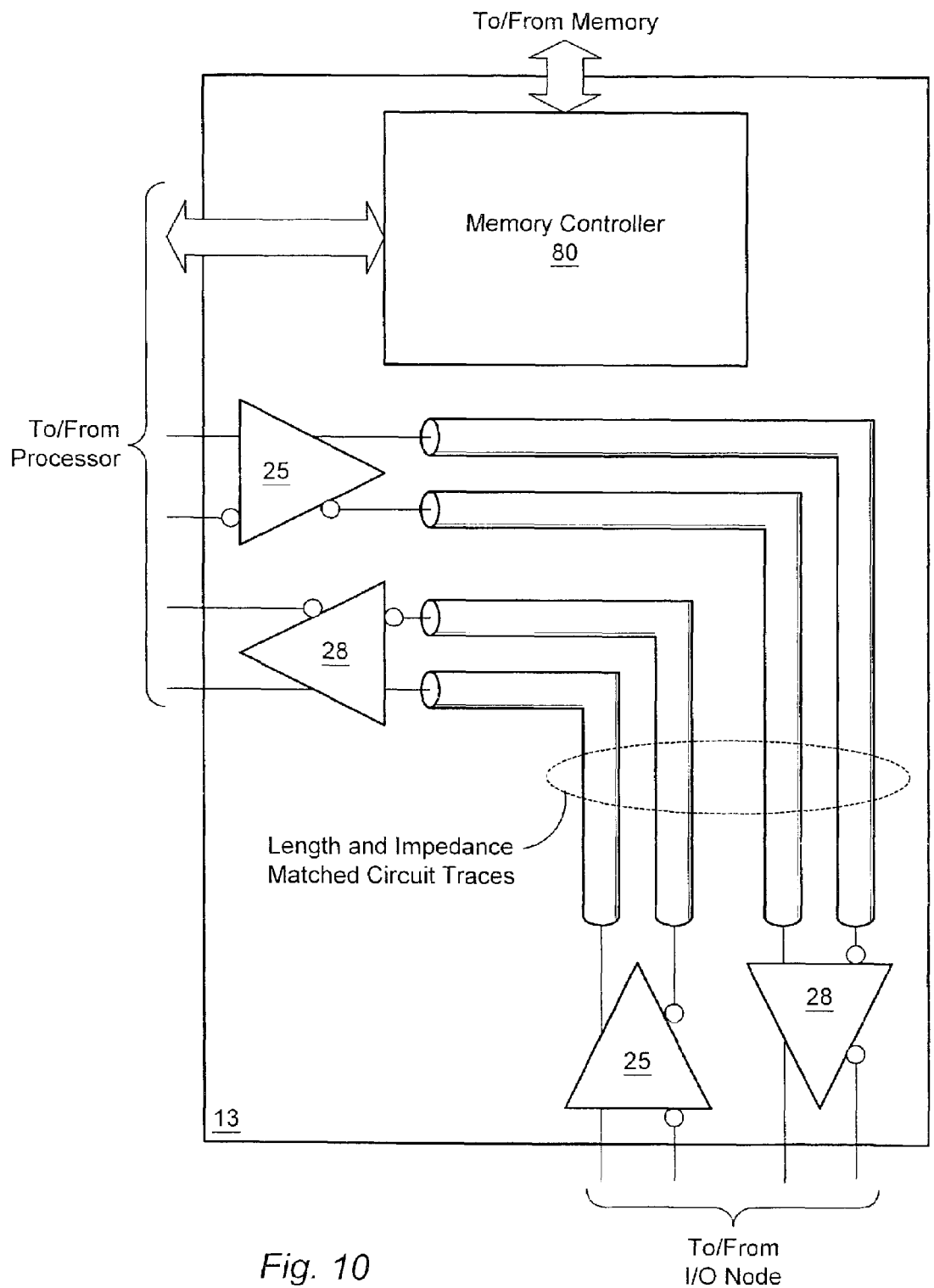
FIG. 10 is a diagram illustrating one embodiment of a bridging circuit utilizing an active compensation scheme and having a memory controller.

Turning now to FIG. 10 a diagram illustrating one embodiment of a bridging circuit utilizing an active compensation scheme and having a memory controller is shown. In the embodiment shown, bridging circuit 13 includes memory controller 80 in addition to the other active compensation circuitry discusses in reference to FIG. 9. Memory controller 80 may be coupled to a processor and a memory bank. In some embodiments, memory controller 80 may also be coupled to an I/O node. This particular embodiment of bridging circuit 13 may be particularly useful for computer systems such as that shown in FIG. 2, wherein processor 10A would not normally have access to memory unit 12B when nothing is installed in processor socket 11.

Memory controller 80 may provide various memory control and access functions that would normally be provided by a processor located in the processor socket in which bridging circuit 13 is mounted. These functions may include writing to memory, reading from memory, and buffering for transactions between the various chips in the computer system.

While not explicitly shown here, additional impedance matching circuitry may be present and associated with memory controller 80. The circuitry may employ active or passive compensation as described above. The impedance matching circuitry may ensure the signal integrity of memory signals that are conveyed between the memory bank and the processor through bridging circuit 13.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A computer system comprising:
a first processor socket and a second processor socket, the first and second processor sockets mounted on a printed circuit board (PCB) and electrically coupled to each other; and
a first I/O node electrically coupled to the first socket and a second I/O node electrically coupled to the second processor socket;
wherein a processor is mounted in the first socket and a bridging circuit is mounted in the second socket, wherein the bridging circuit electrically couples the second I/O node to the processor, wherein the bridging circuit is configured to provide an impedance-matched signal path between the processor and the second I/O node, wherein the bridging circuit provides impedance matching using passive compensation circuitry by varying the width of a circuit trace.

2. The computer system as recited in claim 1, wherein the bridging circuit is further configured to provide timing compensation by approximately matching circuit trace lengths.

3. The computer system as recited in claim 1, wherein signals are conveyed between the processor and the second I/O node using single-mode signaling.

4. The computer system as recited in claim 1, wherein signals are conveyed between the processor and the second I/O node using differential mode signaling.

5. The computer system as recited in claim 4, wherein signals are conveyed between the processor and the second I/O node using odd-mode excitation.

6. The computer system as recited in claim 1, wherein the second processor socket is mounted to the PCB by a land-grid array (LGA) connection.

7. The computer system as recited in claim 1, wherein the second processor socket is mounted to the PCB by a ball-grid array (BGA) connection.

8. The computer system as recited in claim 1, wherein the second processor socket is mounted to the PCB by a pin-grid array (PGA) connection.

9. The computer system as recited in claim 1, wherein the second processor socket is integrated into the PCB, and wherein the bridging circuit is mounted directly to the PCB.

10. The computer system as recited in claim 1, wherein the bridging circuit is implemented on an integrated circuit (IC).

11. The computer system as recited in claim 1, wherein the bridging circuit is implemented using discrete components.

12. A method comprising:
providing a first processor socket and a second processor socket, the first and second processor sockets mounted on a printed circuit board (PCB) and electrically coupled to each other, and wherein the first processor socket is electrically coupled to a first I/O node and the second processor socket is electrically coupled to a second I/O node;
mounting a processor in the first processor socket; and
coupling the processor to the second I/O node by mounting a bridging circuit in the second processor socket, wherein the bridging circuit provides an impedance-matched signal path between the processor and the second I/O node, wherein the bridging circuit provides impedance matching using passive compensation circuitry by varying the width of a circuit trace.

13. The method as recited in claim 12, wherein the bridging circuit provides timing compensation by approximately matching circuit trace lengths.

14. The method as recited in claim 12, wherein signals are conveyed between the processor and the second I/O node using single-mode signaling.

15. The method as recited in claim 12, wherein signals are conveyed between the processor and the second I/O node using differential mode signaling.

16. The method as recited in claim 15, wherein signals are conveyed between the processor and the second I/O node using odd-mode excitation.

17. The method as recited in claim 12, wherein the second processor socket is mounted to the PCB by a land-grid array (LGA) connection.

18. The method as recited in claim 12, wherein the second processor socket is mounted to the PCB by a ball-grid array (BGA) connection.

19. The method as recited in claim 12, wherein the second processor socket is mounted to the PCB by a pin-grid array (PGA) connection.

20. The method as recited in claim 12, wherein the second processor socket is integrated into the PCB, and wherein the bridging circuit is mounted directly to the PCB.

21. The method as recited in claim 12, wherein the bridging circuit is implemented on an integrated circuit (IC).

22. The method as recited in claim 12, wherein the bridging circuit is implemented using discrete components.

23. A bridging circuit comprising:
A plurality of pins for connecting the bridging circuit to a printed circuit board (PCB) of a computer system, the computer system including a first processor socket coupled to a first I/O node and a second processor socket coupled to a second I/O node, wherein a processor is mounted in the first processor socket and wherein the bridging circuit is mounted in the second processor socket; and
a compensation network, wherein the compensation network is configured to provide an impedance matched signal path between the processor and the second I/O node, wherein the bridging circuit includes passive compensation circuitry, and wherein the passive compensation circuitry provides impedance matching by varying the width of a circuit trace.

24. The bridging circuit as recited in claim 23, wherein the bridging circuit is further configured to provide timing compensation by approximately matching circuit trace lengths.

25. The bridging circuit as recited in claim 23, wherein the bridging circuit includes a memory controller coupled to the processor and a memory unit.

26. The bridging circuit as recited in claim 23, wherein the bridging circuit is implemented on an integrated circuit (IC).

27. The bridging circuit as recited in claim 23, wherein the bridging circuit is implemented using discrete components.

28. A computer system comprising:
a first processor socket and a second processor socket, the first and second processor sockets mounted on a printed circuit board (PCB) and electrically coupled to each other; and
a first I/O node electrically coupled to the first socket and a second I/O node electrically coupled to the second processor socket;
wherein a processor is mounted in the first socket and a bridging circuit is mounted in the second socket, wherein the bridging circuit electrically couples the second I/O node to the processor, wherein the bridging circuit is configured to provide an impedance-matched signal path between the processor and the second I/O node, wherein the bridging circuit provides impedance matching using active compensation circuitry, wherein the active compensation circuitry includes a repeater circuit.

29. The computer system as recited in claim 28, wherein the active compensation circuit includes a transceiver circuit, the transceiver circuit, the transceiver circuit coupled to the repeater circuit by impedance matched circuit traces, the impedances of the circuit traces approximately matching the input impedance of the repeater circuit and the output impedance of the transceiver circuit.

30. The computer system as recited in claim 29, wherein the impedance matched circuit traces are of approximately equal lengths.

31. The computer system as recited in claim 29, wherein the transceiver circuit is coupled to receive a signal from a first circuit trace on printed circuit board (PCB), and wherein an input impedance of the transceiver circuit is approximately matched to an impedance of the first circuit trace.

32. The computer system as recited in claim 31, wherein the repeater circuit is coupled to drive a signal onto a second circuit trace, wherein an output impedance of the repeater circuit is approximately equal to an impedance of the second circuit trace.

33. The computer system as recited in claim 32, wherein the first circuit trace and the second circuit trace are micro-strip transmission lines.

34. The computer system as recited in claim 28, wherein the bridging circuit includes a memory controller, the memory controller coupled to the processor and a memory unit.

35. A method comprising:
providing a first processor socket and a second processor socket, the first and second processor sockets mounted on a printed circuit board (PCB) and electrically coupled to each other, and wherein the first processor socket is electrically coupled to a first I/O node and the second processor socket is electrically coupled to a second I/O node;
mounting a processor in the first processor socket; and
coupling the processor to the second I/O node by mounting a bridging circuit in the second processor socket, wherein the bridging circuit provides an impedance-matched signal path between the processor and the second I/O node, and wherein the bridging circuit provides impedance matching using active compensation circuitry, the active compensation circuitry including a repeater circuit.

36. The method as recited in claim 35, wherein the active compensation circuitry includes a transceiver circuit, the transceiver circuit coupled to the repeater circuit by impedance matched circuit traces, the impedances of the circuit traces approximately matching the input impedance of the repeater circuit and the output impedance of the transceiver circuit.

37. The method as recited in claim 36, wherein the impedance matched circuit traces are of approximately equal lengths.

38. The method as recited in claim 36, wherein the transceiver circuit is coupled to receive a signal from a first circuit trace on printed circuit board (PCB), and wherein an input impedance of the transceiver circuit is approximately matched to an impedance of the first circuit trace.

39. The method as recited in claim 38, wherein the repeater circuit is coupled to drive a signal onto a second circuit trace, wherein an output impedance of the repeater circuit is approximately equal to an impedance of the second circuit trace.

40. The method as recited in claim 39, wherein the first circuit trace and the second circuit trace are micro-strip transmission lines.

41. The method as recited in claim 35, wherein the bridging circuit includes a memory controller, the memory controller coupled to the processor and a memory unit.

42. A computer system comprising:
a first processor socket and a second processor socket, the first and second processor sockets mounted on a printed circuit board (PCB) and electrically coupled to each other; and
a first I/O node electrically coupled to the first socket and a second I/O node electrically coupled to the second processor socket;
wherein a processor is mounted in the first socket and a bridging circuit is mounted in the second socket, wherein the bridging circuit electrically couples the second I/O node to the processor, wherein the bridging circuit is configured to provide an impedance-matched signal path between the processor and the second I/O node, wherein the bridging circuit provides impedance matching using active compensation circuitry, and wherein the bridging circuit includes a memory controller, the memory controller coupled to the processor and a memory unit.

43. A method comprising:
providing a first processor socket and a second processor socket, the first and second processor sockets mounted on a printed circuit board (PCB) and electrically coupled to each other, and wherein the first processor socket is electrically coupled to a first I/O node and the second processor socket is electrically coupled to a second I/O node;
mounting a processor in the first processor socket; and
coupling the processor to the second I/O node by mounting a bridging circuit in the second processor socket, wherein the bridging circuit provides an impedance-matched signal path between the processor and the second I/O node, and wherein the bridging circuit provides impedance matching using active compensation circuitry, wherein the bridging circuit includes a memory controller, the memory controller coupled to the processor and a memory unit.

44. A bridging circuit comprising:
A plurality of pins for connecting the bridging circuit to a printed circuit board (PCB) of a computer system, the computer system including a first processor socket coupled to a first I/O node and a second processor socket coupled to a second I/O node, wherein a processor is mounted in the first processor socket and wherein the bridging circuit is mounted in the second processor socket; and
a compensation network, wherein the compensation network is configured to provide an impedance matched signal path between the processor and the second I/O node, wherein the bridging circuit provides impedance matching using active compensation circuitry, wherein the active compensation circuitry includes a repeater circuit.

45. The bridging circuit as recited in claim 44, wherein the active compensation circuit includes a transceiver circuit, the transceiver circuit, the transceiver circuit coupled to the repeater circuit by impedance matched circuit traces, the impedances of the circuit traces approximately matching the input impedance of the repeater circuit and the output impedance of the transceiver circuit.

46. The bridging circuit as recited in claim 45, wherein the impedance matched circuit traces are of approximately equal length.

47. The bridging circuit as recited in claim 45, wherein the transceiver circuit is coupled to receive a signal from a first circuit trace on printed circuit board (PCB), and wherein an input impedance of the transceiver circuit is approximately matched to an impedance of the first circuit trace.

48. The bridging circuit as recited in claim 47, wherein the repeater circuit is coupled to drive a signal onto a second circuit trace, wherein an output impedance of the repeater circuit is approximately equal to an impedance of the second circuit trace.

49. The bridging circuit as recited in claim 48, wherein the first circuit trace and the second circuit trace are micro-strip transmission lines.

50. A bridging circuit comprising:
A plurality of pins for connecting the bridging circuit to a printed circuit board (PCB) of a computer system, the computer system including a first processor socket coupled to a first I/O node and a second processor socket coupled to a second I/O node, wherein a processor is mounted in the first processor socket and wherein the bridging circuit is mounted in the second processor socket; and a compensation network, wherein the compensation network is configured to provide an impedance matched signal path between the processor and the second I/O node, wherein the bridging circuit includes a memory controller coupled to the processor and a memory unit.

* * * * *